United States Patent
Hill

(10) Patent No.: US 7,199,476 B2
(45) Date of Patent: Apr. 3, 2007

(54) ELECTRONIC DEVICE

(75) Inventor: Wolfgang Hill, Karlsruhe (DE)

(73) Assignee: LuK Lamellen und Kupplungsbau Beteiligungs KG, Buehl (DE)

( * ) Notice: Subject to any disclaimer, the term of this patent is extended or adjusted under 35 U.S.C. 154(b) by 215 days.

(21) Appl. No.: 10/970,527

(22) Filed: Oct. 21, 2004

(65) Prior Publication Data

US 2005/0087881 A1 Apr. 28, 2005

(30) Foreign Application Priority Data

Oct. 23, 2003 (DE) .................... 103 49 444

(51) Int. Cl.
*H01L 23/48* (2006.01)

(52) U.S. Cl. ........................ 257/772; 257/779

(58) Field of Classification Search ............. 257/772, 257/779; 438/612
See application file for complete search history.

(56) References Cited

U.S. PATENT DOCUMENTS 2,530,552 A * 11/1950 Stoddard, Jr. ............. 204/286.1
5,746,367 A * 5/1998 Pai et al. ...................... 228/19
6,822,331 B2 * 11/2004 Eytcheson .................. 257/773

* cited by examiner

*Primary Examiner*—Roy Karl Potter
(74) *Attorney, Agent, or Firm*—Davidson, Davidson & Kappel, LLC

(57) ABSTRACT

An electronic device has at least one semiconductor chip, which has mutually opposing contact sides, of which one first contact side is electroconductively surface-bonded via a first, solid soldering-agent layer to at least one first metallic conductor part. The semiconductor chip is electroconductively surface-bonded on its second contact side facing opposite the first contact side via a second soldering-agent layer to at least one second metallic conductor part. The softening temperature of the second soldering-agent layer is adapted to an operating temperature that occurs in this soldering-agent layer during operation of the device in such a way that the second soldering-agent layer is doughy or liquid at the operating temperature. The second soldering-agent layer is laterally bounded by a flow-off protection device.

24 Claims, 3 Drawing Sheets

ELECTRONIC DEVICE

Priority is claimed to German Patent Application No. DE 103 49 444.8, filed on Oct. 23, 2003, the entire disclosure of which is incorporated by reference herein.

The present invention is directed to an electronic device having at least one semiconductor chip, which has mutually opposing contact sides, of which one first contact side is electroconductively surface-bonded via a first, solid soldering-agent layer to at least one first metallic conductor part. The present invention is also directed to an electronic device having at least one semiconductor chip which is electroconductively surface-bonded on one contact side via at least one solid soldering-agent layer to at least one metallic conductor part.

BACKGROUND

An electronic device of this kind, designed as an output stage for driving a brushless electromotor, is known in the field. As semiconductor chips, the device has a plurality of transistors which are mounted on a printed-circuit board. On their front and back flat sides, the semiconductor chips have electrical points of contact, of which one is surface-bonded in each case on the rear side of the semiconductor chip facing the printed-circuit board, to a conductor part. A bonding wire is connected in each case via an ultrasonically welded connection to the points of contact located on the front sides of the semiconductor chips. The bonding wires are made of aluminum, and their diameter is limited to approximately 0.3 to 0.5 millimeters. Thus, they have a relatively high ohmic resistance, which can amount to over 1 mΩ. This is particularly disadvantageous when driving electromotors which have only a small number of windings. Electromotors of this kind can, in fact, be manufactured inexpensively, however they require a relatively high motor current, from which the requirement arises of designing the motor circuit and, thus, also the output stage to be as low-resistance as possible.

From the field, one also already knows of an electronic device in which the semiconductor chip is electroconductively surface-bonded on one contact side via a soldering-agent layer to a metallic conductor part. The semiconductor chip and the conductor part have different thermal expansion coefficients. Since the semiconductor chip and the conductor part warm up when the device is brought into circuit, due to the dissipation heat generated primarily in the semiconductor chip, they expand to different degrees. To reduce the mechanical stresses resulting from this variable expansion in the semiconductor chip, the softening temperature of the soldering-agent layer is adjusted to the operating temperature of the device in such a way that the soldering-agent layer is doughy or liquid at the operating temperature. To prevent the soldering-agent layer from flowing off from the side of the soldering gap formed between the conductor part and the semiconductor chip, the soldering-agent layer is laterally bounded by a flow-off protection device. However, the disadvantage of the soldering-agent layer is that it still has a relatively high electrical resistance and a correspondingly low thermal conductivity.

SUMMARY OF THE INVENTION

An object of the present invention is, therefore, to devise an electronic device of the type mentioned at the outset that will render possible a low ohmic contact resistance between the conductor part and the semiconductor chip and an efficient transfer of heat from the semiconductor chip to the conductor part. Moreover, it is also intended for the electronic device to exhibit a good long-term stability with respect to resisting the temperature fluctuations occurring on the semiconductor chip during normal use.

The present invention provides an electronic device having at least one semiconductor chip (1), which has mutually opposing contact sides (2a, 2b), of which one first contact side (2a) is electroconductively surface-bonded via a first, solid soldering-agent layer (3a) to at least one first metallic conductor part (4a). The semiconductor chip (1) is electroconductively surface-bonded on its second contact side (2a) opposing the first contact side (3a) via a second soldering-agent layer (3b) to at least one second metallic conductor part (4b); the softening temperature of the second soldering-agent layer (3b) is adapted to an operating temperature that occurs in this soldering-agent layer (3b) during operation of the device in such a way that the second soldering-agent layer (3b) is doughy or liquid at the operating temperature; and the second soldering-agent layer (3b) is laterally bounded by a flow-off protection device (5).

Here, the semiconductor chip is advantageously contacted over a surface area in a planar manner on both sides by conductor parts, so that, on the one hand, a low contact resistance results between the conductor parts and the semiconductor chip and, on the other hand, however, the connection of the semiconductor chip to the conductor parts exhibits good thermal conductivity. Thus, the heat produced in the semiconductor chip during operation of the electronic device may be efficiently dissipated via the conductor parts to the ambient environment. Since the soldering-agent layers situated on both sides of the semiconductor chip have different softening temperatures which are adapted to the operating temperature in such a way that, at the operating temperature, the one soldering-agent layer is solid and the other is doughy or liquid, only negligible mechanical stresses occur in the semiconductor chip and in the soldering-agent layers in response to temperature fluctuations in the semiconductor chip. Surprisingly, it turns out that, in practice, it suffices when the semiconductor chip is bonded on only one flat side by a soft soldering-agent layer to a conductor part. Through this measure, the tensile and compressive stresses occurring in response to varying temperatures in the semiconductor chip are substantially reduced in comparison to an electronic device in which the semiconductor chip is bonded on both sides by solid soldering-agent layers to massive conductor parts, so that the electrical contacting between the semiconductor chip and the conductor parts exhibits an excellent long-term stability in spite of the unavoidable temperature fluctuations that occur in practice. The operating temperature is understood to be the maximally occurring temperature in the liquid or doughy soldering-agent layer during normal operational use of the electrical device. The operating temperature is selected in such a way that the semiconductor chip is not thermally damaged in response to the occurrence of the operating temperature. During operation of the device, the operating temperature may be continuously present in the soldering-agent layer. However, it is also possible that the operating temperature is reached only briefly, for example during the occurrence of a peak load.

It is advantageous when the softening temperature of the second soldering-agent layer is lower than 220° C., in some instances lower than 190° C., in particular lower than 160° C., and preferably lower than 130° C. In this context, an excellent long-term stability of the soldered connections may be achieved, in particular, at a softening temperature of less than 130° C.

One practical embodiment of the present invention provides for the flow-off protection device to be made of an electrically insulating material, preferably of plastic or ceramic, which surrounds the second soldering-agent layer in a frame shape. When the material is made of plastic, during manufacture of the electrical device, the flow-off protection device may be simply applied to the semiconductor chip as an encapsulating material that seals off the second soldering-agent layer. A flow-off protection device of ceramic renders possible a high thermal conductivity, which enables the heat produced on the semiconductor chip to not only be dissipated via the soldering-agent layers, but also via the flow-off protection device to the ambient environment.

The semiconductor chip may be designed as a semiconductor switch having a drain terminal, a source terminal, and a gate terminal, the source terminal and the gate terminal being located on the contact side facing the solid soldering-agent layer, and the drain terminal on the opposite contact side of the semiconductor chip facing the soldering-agent layer that is doughy or liquid at operating temperature. This eliminates the need for an electrically insulating sealing element between the soldering agent of the gate terminal and the soldering agent of the drain terminal, in comparison to a configuration where the soldering-agent layer, which is doughy or liquid at operating temperature, is located on the contact side of the semiconductor chip having the gate terminal.

The present invention also provides an electronic device having at least one semiconductor chip which is electroconductively surface-bonded at one contact side (2a) via at least one soldering-agent layer (3a) to at least one metallic conductor part (4a). In addition to the soldering-agent layer (3a), at least one intermediate layer (8) is situated between the conductor part (4a) and/or the semiconductor chip (1); the intermediate layer (8) has at least one solid-state metal element which has a plurality of spaced-apart, flexible metal-element segments (10) which electrically connect the conductor part (4a) with the semiconductor chip (1) and which run with their plane of extension or direction of extension transversely to the plane of the semiconductor chip (1); and freedom-of-motion spaces (11) for the metal-element segments (10) are disposed laterally next to the metal-element segments (10).

It is provided in this context for at least one intermediate layer to be situated between the solid soldering-agent layer and the conductor part and/or the semiconductor chip, this intermediate layer having at least one solid-state metal element which has a plurality of spaced-apart, flexible metal-element segments that electrically connect the conductor part with the semiconductor chip in each case, the flexible metal-element segments running with their plane of extension or direction of extension transversely to the plane of the semiconductor chip, freedom-of-motion spaces for the metal-element segments being disposed laterally next to the metal-element segments.

As already mentioned at the outset, the semiconductor chip and the metallic conductor part have different thermal expansion coefficients. As a result, the semiconductor chip and the conductor part experience different changes in length in response to temperature variations. The flexible metal element advantageously makes it possible to compensate for these changes in length in that the metal-element segments are deflected into the freedom-of-motion spaces. As a result, only very insignificant mechanical stresses occur in the semiconductor chip as well as in the solid soldering-agent layer in response to temperature variations. Moreover, because of the at least one metal element, which may rest directly against the semiconductor chip and/or the conductor part, a low electrical contact resistance, as well as a good thermal coupling result between the semiconductor chip and the conductor part. On the one hand, this reduces the dissipation heat occurring at the contact resistance, and, on the other hand, however, permits the heat produced on the semiconductor chip, in particular, to be efficiently dissipated via the conductor part to the ambient environment. Therefore, the electronic device exhibits a good long-term stability with respect to resisting the temperature fluctuations occurring on the semiconductor chip. A thin, solid soldering-agent layer may be placed on both sides of the intermediate layer to bond the intermediate layer to the semiconductor chip and the conductor part.

It is beneficial when the metal-element segments, starting from the one end and continuing to the other end of the metal element, alternately run toward or away from the semiconductor chip, and when the metal-element segments preferably form wave shapes and/or loops. The result is an even lower electrical and thermal contact resistance between the semiconductor chip and the conductor part.

In one preferred specific embodiment, the metal element is a metal foil. In this case, the metal element is highly flexible and, in response to temperature fluctuations, permits an especially good compensation of various changes in length of the semiconductor chip, on the one hand, and of the conductor part, on the other hand. Moreover, the metal foil can be manufactured inexpensively.

In one practical embodiment of the present invention, the metal foil has at least two spaced apart, strip-shaped regions, which run more or less in parallel with one another, the metal-element segments alternately running toward the semiconductor chip and away from the same being disposed one behind the other in the longitudinal direction of these strip-shaped regions. The strip-shaped regions make it possible to compensate for various changes in length of the semiconductor chip and of the conductor part that occur both transversely to the strip-shaped regions as well in their longitudinal direction.

Another advantageous specific embodiment of the present invention provides for the conductor part to have at least one slot which extends through the conductor part transversely to the plane of extension of the semiconductor chip, the intermediate layer being bonded electroconductively on both sides of the slot to the conductor part, and the metal-element segments alternately running toward the semiconductor chip and away from the same being disposed one behind the other in the longitudinal direction of the slot. This measure makes it possible to compensate for various changes in length of the semiconductor chip and of the conductor part that take place transversely to the plane of the slot and in parallel to the plane of the semiconductor chip in response to the occurrence of temperature fluctuations.

It is beneficial when the conductor part has web-shaped sections on both sides of the at least one slot which laterally bound the slot and which are joined together in one piece at their ends by crossbars, and when at least one end region of at least one of the web-shaped sections facing a crossbar, a deformation region is provided where the web-shaped section is curved or bent in preferably mutually opposing directions. The web-shaped sections may then move toward or away from one another in response to various changes in length of the semiconductor chip material and of the material of the conductor part that occur in response to temperature fluctuations, so that the mechanical stresses in the soldering-agent layer are reduced accordingly.

In one practical specific embodiment of the present invention, the metal elements are fibers of a woven fabric. Various changes in length of the semiconductor chip and of the conductor part caused by temperature fluctuations may be compensated in equal measure by the fibers in directions running transversely to one another and in parallel to the plane of the semiconductor chip. The woven fabric renders possible a high density of the fibers, the result being a low electrical contact resistance and a low thermal transfer resistance between the semiconductor chip and the conductor part.

In another specific embodiment of the present invention, the metal elements are fibers of a nonwoven fabric. The intermediate layer may then be produced very cost-effectively.

It is especially beneficial when the freedom-of-motion spaces for the metal-element segments are filled with a solder that is doughy or liquid at an operating temperature that occurs in the freedom-of-motion spaces during operation of the device. This makes it possible to further reduce the electrical contact resistance and the thermal transfer resistance between the semiconductor chip and the conductor part. In this context, the at least one metal element may be optionally designed as a flow-off protection device for the doughy or liquid solder. It is also conceivable, however, for a seal to be provided as a flow-off protection device at an edge area of the intermediate layer, in addition to the metal element(s).

The conductor parts may be made of copper, preferably of pure copper. This material is preferred because of its high thermal conductivity and its good electrical conductivity.

The electronic device is preferably designed as an output stage for driving an electrical machine, in particular a brushless electromotor, which has at least two of the semiconductor switches, at least one of the conductor parts acting as a conductor bridge interconnecting the semiconductor switches to form at least one half-bridge. The result is an especially compact design of the output stage. Due to the low electrical contact resistance and the efficient thermal coupling between the semiconductor chip and the conductor parts, the output stage permits a highly dynamic driving of the electromotor. This is especially beneficial in vehicle engineering, for example, for disengagement motors used for clutches.

BRIEF DESCRIPTION OF THE DRAWINGS

Exemplary embodiments of the present invention are explained in greater detail in the following with reference to the drawing. Specifically shown in.

DETAILED DESCRIPTION

An electronic device, namely an output stage for driving the winding of a brushless electromotor, has a plurality of semiconductor chips 1 designed as power transistors, which in a manner known per se form a bridge circuit having a plurality of interconnected half-bridges.

Figure 1:
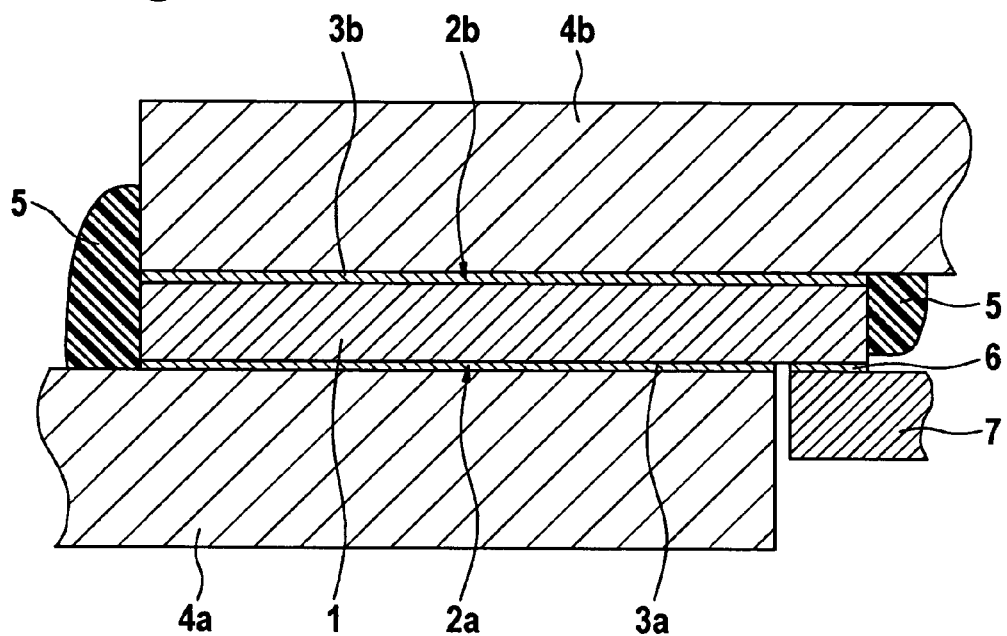
FIG. 1 is a partial cross-section through an electrical device having a semiconductor chip that is surface-bonded on both sides via soldering-agent layers to massive conductor parts made of copper.

In the exemplary embodiment shown in FIG. 1, the mutually opposing flat sides of semiconductor chip 1 are each formed as contact sides 2a, 2b. A first contact side 2a is electroconductively surface-bonded via a first soldering-agent layer 3a to a first metallic conductor part 4a. A second contact side 2b is electroconductively surface-bonded via a second soldering-agent layer 3b to a second metallic conductor part 4b. In this context, soldering-agent layers 3a, 3b are surface-bonded, with their one flat side to the facing contact side 2a, 2b, of semiconductor chip 1 and, with their opposing other flat side to the corresponding conductor part 4a, 4b. Conductor parts 4a, 4b are designed as massive conducting tracks of pure copper, whose dimensions or thickness normal to the plane of semiconductor chip 1 are greater than those of semiconductor chip 1. The copper material of conductor parts 4a, 4b and the material of semiconductor chip 1 have different expansion coefficients.

Soldering-agent layers 3a, 3b have different softening temperatures. These softening temperature are adapted to an operating temperature that occurs in soldering-agent layers 3a, 3b during operation of the electronic device in such a way that first soldering-agent layer 3a is solid at the operating temperature and second soldering-agent layer 3b is doughy or liquid. The operating temperature is essentially determined by the heat produced in semiconductor chip 1 in response to a current flow and by the dissipation of heat from semiconductor chip 1 via soldering-agent layers 3a, 3b and conductor parts 4a, 4b to the ambient environment. The softening temperature of first soldering-agent layer 3a is higher than 210° C. The softening temperature of second soldering-agent layer 3b is more or less between 130° C. and 160° C.

Virtually no mechanical stresses arise in the doughy or liquid soldering-agent layer 3b in spite of the differences in the expansion coefficients of the material of conductor parts 4a, 4b and of the material of semiconductor chip 1. Compared to a semiconductor chip, which is surface-bonded on both contact sides via solid soldering-agent layers to conductor parts, the mechanical stresses are also reduced in solid soldering-agent layer 3a due to the doughy or liquid state of soldering-agent layer 3b. Therefore, the bonding of semiconductor chip 1 is characterized by a good long-term stability with respect to resisting the temperature fluctuations occurring in soldering-agent layers 3a, 3b.

In FIG. 1, one can discern that second soldering-agent layer 3b is laterally bounded by a flow-off protection device 5 made of an electrically insulating material, preferably of an elastic plastic. Flow-off protection device 5 surrounds the semiconductor chip in a frame shape and laterally seals off the space formed between contact side 2b of semiconductor chip 1 and conductor part 4b, from semiconductor chip 1 and conductor part 4b.

Semiconductor chip 1 has a source terminal, a drain terminal and a gate terminal. The source terminal and the gate terminal are located on contact side 2a and the drain terminal on the other, opposite contact side 2b of semiconductor chip 1. Conductor part 4a is designed as a source contact and is connected via solid soldering-agent layer 3a to the source terminal facing it. Laterally next to soldering-agent layer 3a, a soldering point 6 is provided which joins the gate terminal of semiconductor chip 1 to a gate contact 7. The soldering agent of soldering point 6 is solid at the operating temperature. In FIG. 1, one can discern that soldering point 6 is laterally spaced apart from soldering-agent layer 3a. Conductor part 4b is designed as a drain contact and is bonded via soldering-agent layer 3b, which is doughy or liquid at the operating temperature, to the drain terminal facing it.

Figure 2:
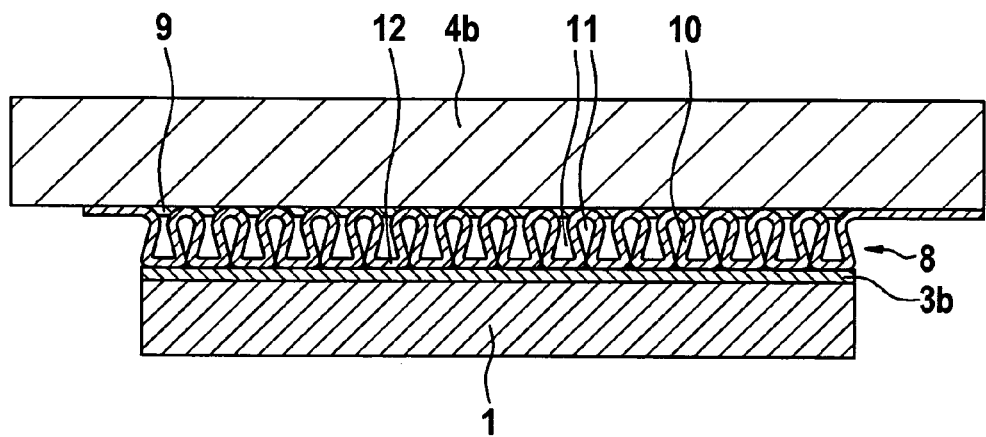
FIG. 2 is a partial cross-section through an electrical device having a semiconductor chip that is bonded on one side via two soldering-agent layers and a corrugated metal foil disposed therebetween to a massive conductor part made of copper.

In the exemplary embodiment shown in FIG. 2, semiconductor chip 1 is electroconductively surface-bonded only at its contact side 2b having the drain terminal, to a massive, metallic conductor part 4b. On its other contact side 2a disposed oppositely to contact side 2b, semiconductor chip 1 has a source terminal and a gate terminal, which are contacted in a point-by-point manner via bonding wires (not shown in greater detail in the drawing). Situated between semiconductor chip 1 and conductor part 4b is an intermediate layer 8 which, on its one flat side, is surface-bonded in each case via a soldering-agent layer 3b to contact side 2b of semiconductor chip 1 and, on its other flat side, via a soldering layer 9 to conductor part 4b.

Figure 3:
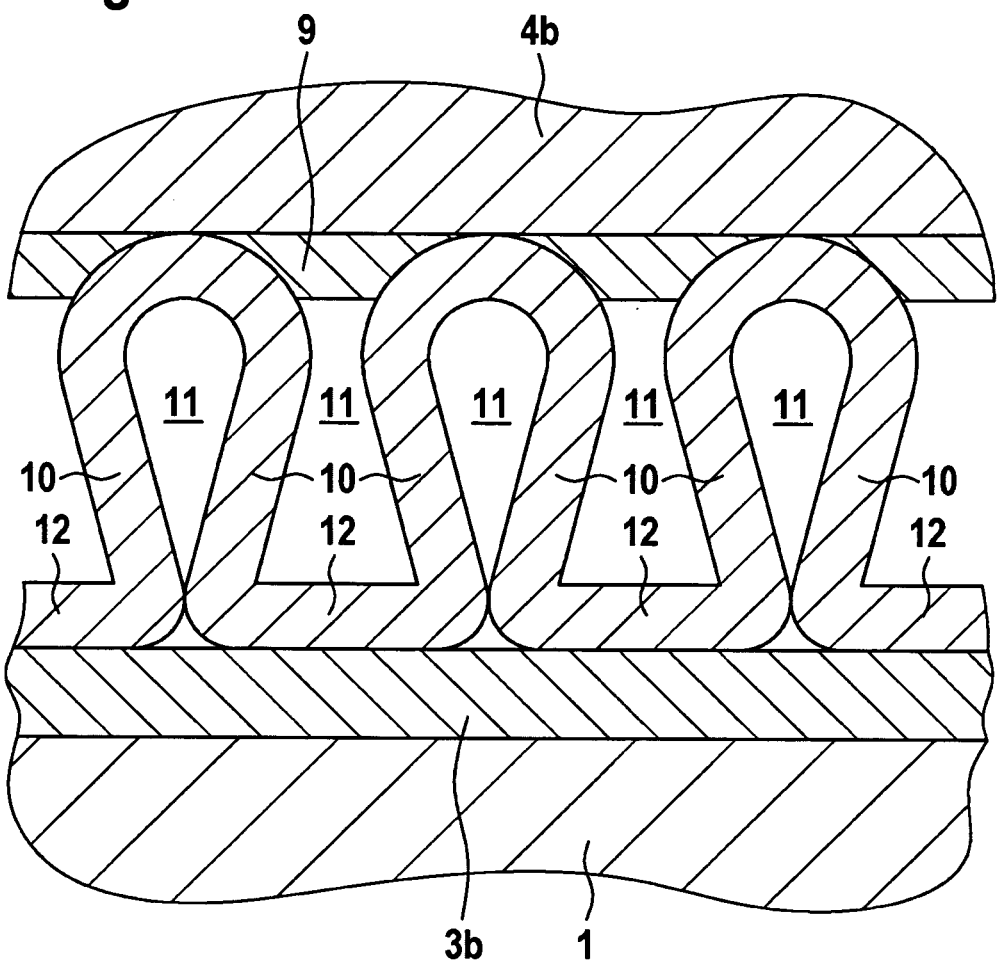
FIG. 3 is an enlarged detail from FIG. 2.

Intermediate layer 8 has at least one solid-state metal element formed by a pure copper foil, which has a plurality of spaced-apart, flexible metal-element segments 10 that electrically connect conductor part 4b to semiconductor chip 1. As is easily discernible in FIG. 3, metal-element segments 10 each run with their plane of extension transversely to the plane of semiconductor chip 1. Between mutually adjacent metal-element segments 10, a freedom-of-motion space 11 is formed in each case, which is free of soldering agent and in which metal-element segments 10 may be deflected transversely to their plane of extension when the materials of the metal element and of semiconductor chip 1 expand to different degrees in response to a temperature fluctuation. It is discernible in FIGS. 2 and 3 that metal-element segments 10, starting from the one end and continuing to the other end of the metal element, alternately run toward or away from the semiconductor chip 1. In this context, metal-element segments 10 form a multiplicity of loops and or wave shapes, which have more or less the same dimensions and are spaced apart equidistantly from one another. In FIG. 3, it is discernible that metal-element segments 10 are interconnected by connecting segments 12 which run in parallel to the plane of the semiconductor chip and are surface-bonded via soldering layer 9 to conductor part 4a. At their ends that are set apart from connecting segments 12 and that project the furthest in the direction of conductor part 4b, the loops or wave shapes touch contact side 2b of semiconductor chip 1. At these ends, the loops or wave shapes are soldered via soldering-agent layer 3b to semiconductor chip 1.

Figure 4:
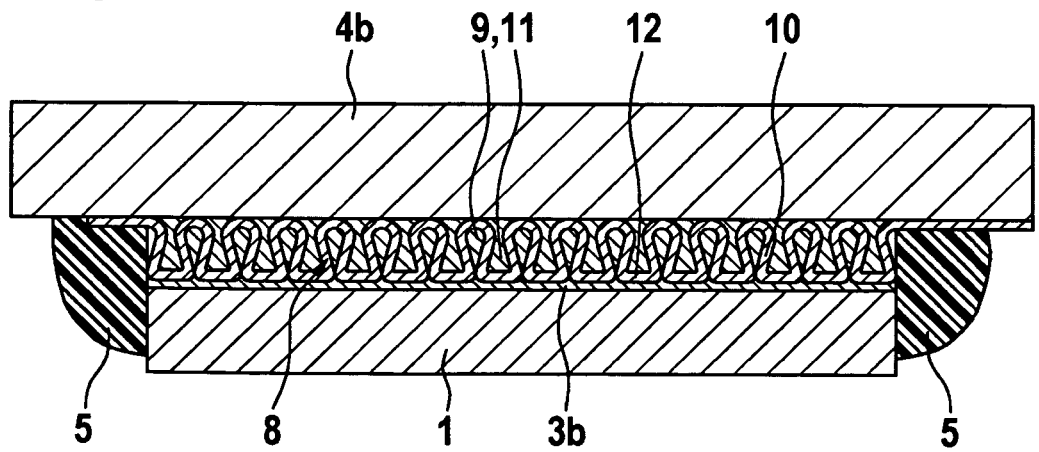
FIG. 4 is a representation similar to that of FIG. 2, one of the two soldering-agent layers being made of a material, however, which is pasty or liquid at operating temperature.

In the exemplary embodiment illustrated in FIG. 4, the softening temperature of soldering layer 9 is adapted to an operating temperature that occurs in soldering layer 9 during operation of the device in such a way that soldering layer 9 is doughy or liquid at the operating temperature. In contrast to the exemplary embodiment in accordance with FIGS. 2 and 3, in the exemplary embodiment according to FIG. 4, soldering layer 9 extends into freedom-of-motion spaces 11 and preferably fills them in completely. As a result, the bond between semiconductor chip 1 and the conductor part is characterized by an especially high electric and thermal conductivity.

Figure 5:
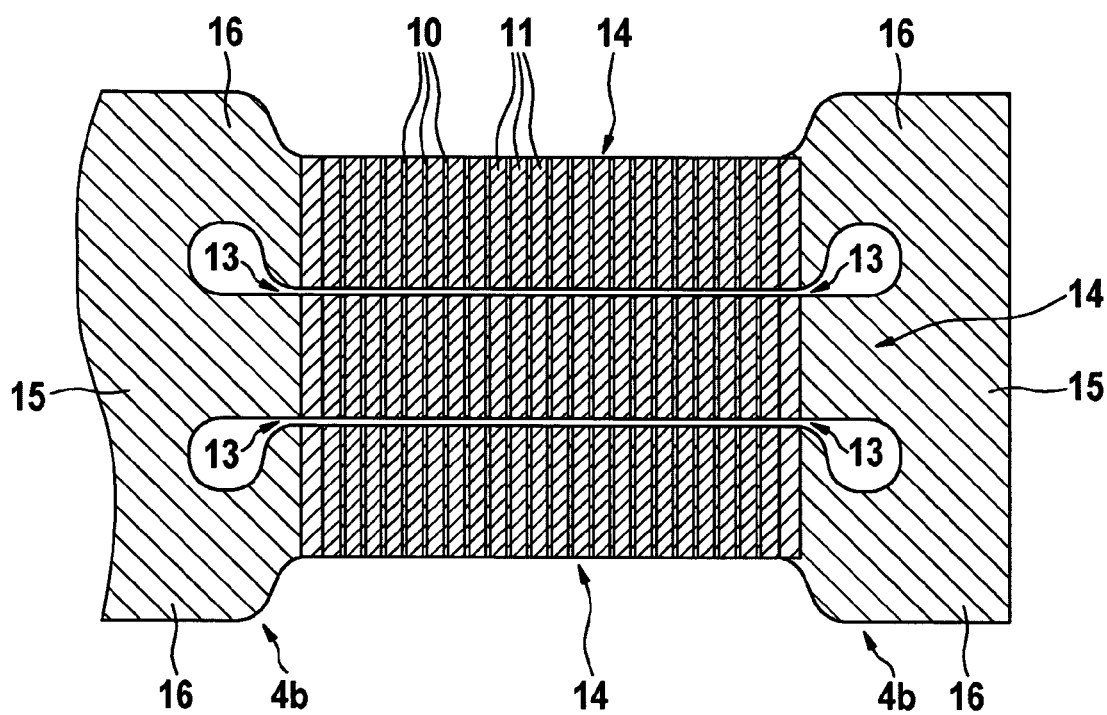
FIG. 5 is a plan view of a conductor part, on which a corrugated metal foil is situated, the surface of the metal foil that contacts the semiconductor chip being shown.

In the exemplary embodiment shown in FIG. 5, which shows a view from an underside of conductor part 4b, conductor part 4b has two slots 13 which run in parallel to one another and which extend through conductor part 4b more or less at right angles to the plane of extension of semiconductor chip 1 and at right angles to the longitudinal-extension direction of metal-element segments 10. It is clearly discernible that metal-element segments 10 alternately running toward the semiconductor chip 1 and away from the same are disposed one behind the other in the longitudinal direction of slots 13. Each of slots 13 is bounded on both sides by web-shaped sections 14 of conductor part 4b. These web-shaped sections 14 are joined together in one piece at their ends, on both sides, by crossbars 15.

The end regions of the two outer web-shaped sections 14 facing crossbars 15 are each formed as deformation regions 16 which enable the regions of web-shaped sections 14 covering intermediate layer 8 to move elastically toward and away from one another. Starting out from their end facing crossbar 15 and continuing to their other end that is distant therefrom, deformation regions 16 are curved in mutually opposing directions in such a way that, starting out from crossbar 15 and continuing to their end that is distant therefrom, they run obliquely toward a middle web-shaped section 14 of conductor part 4b. In the regions situated between deformation regions 16, in each case, web-shaped sections 14 contact intermediate layer 8 directly and/or via soldering layer 9. In combination with slots 13, the mechanical stresses that arise in semiconductor chip 1 with the occurrence of temperature fluctuations in the plane of semiconductor chip 1 running in directions transversely to one another are reduced

What is claimed is:

1. An electronic device comprising:
   a first metallic conductor part;
   a second metallic conductor part;
   a semiconductor chip disposed between the first and second metallic conductor parts and having mutually opposing first and second contact sides;
   a first solid soldering-agent layer disposed between the first contact side and the first metallic conductor part;
   a second soldering-agent layer having a softening temperature and disposed between the second contact side and the second metallic conductor part; and
   a flow off protection device laterally bounding the second soldering-agent layer,
   wherein the first contact side is electroconductively surface-bonded via the first, solid soldering-agent layer to the first metallic conductor part, and the second contact side is electroconductively surface-bonded via the second soldering-agent layer to the second metallic conductor part, and wherein the softening temperature of the second soldering-agent layer is adapted to an operating temperature occuring in the second soldering-agent layer during operation of the device so that the second soldering agent layer is at one of a doughy state and a liquid state at the operating temperature.

2. The electronic device as recited in claim 1, wherein the softening temperature of the second soldering-agent layer is lower than 220° C.

3. The electronic device as recited in claim 1, wherein the softening temperature of the second soldering-agent layer is lower than 130° C.

4. The electronic device as recited in claim 1, wherein the flow-off protection device includes an electrically insulating material and surrounds the second soldering-agent layer in a frame shape.

5. The electronic device as recited in claim 4, wherein the insulating material is at least one of plastic and ceramic.

6. The electronic device as recited in claim 1, wherein the semiconductor chip is a semiconductor switch.

7. The electronic device as recited in claim 6, wherein the semiconductor switch is a power transistor.

8. The electronic device as recited in claim 6, wherein the semiconductor switch includes a source terminal and a gate terminal disposed on the first contact side, and a drain terminal disposed on the second contact side.

9. An electronic device, comprising:
a metallic conductor part;
a semiconductor chip having a contact side disposed adjacent the metallic conductor part;
a soldering-agent layer disposed between the contact side and the metallic conductor part, wherein the contact side is electroconductively surface-bonded to the metallic conductor part via the soldering-agent layer; and
an intermediate layer disposed between the metallic conductor part and the semiconductor chip, the intermediate layer including a solid-state metal element having a plurality of spaced-apart, flexible metal-element segments electrically connecting the conductor part with the semiconductor chip, a plurality of freedom-of-motion spaces being disposed laterally next to the metal-element segments, wherein the plurality of flexible metal-element segments extend in a direction transverse to a plane of extension of the semiconductor chip.

10. The electronic device as recited in claim 9, wherein, starting from a first end and continuing an opposite end of the solid-state metal element, the metal-element segments alternately run toward and away from the semiconductor chip.

11. The electronic device as recited in claim 10, wherein the metal-element segments form at least one of wave shapes and loops.

12. The electronic device as recited in claim 9, wherein the metal element is a metal foil.

13. The electronic device as recited in claim 9, wherein the freedom-of-motion spaces are filled with a solder that is at one of a doughy state and a liquid state at an operating temperature occuring in the solder during operation of the device.

14. The electronic device as recited in claim 12, wherein the metal foil includes at least two spaced apart, strip-shaped regions running substantially parallel with one another, and wherein the metal-element segments are disposed one behind the other in a longitudinal direction of the strip-shaped regions.

15. The electronic device as recited in claim 9, wherein the conductor part includes a slot extending through the conductor part transverse to the plane of extension of the semiconductor chip, wherein the intermediate layer is electroconductively bonded on both sides of the slot to the conductor part; and wherein the metal-element segments are disposed one behind the other in a longitudinal direction of the slot.

16. The electronic device as recited in claim 15, wherein the conductor part includes web-shaped sections on both sides of the at least one slot and laterally bounding the slot, the web-shaped sections being joined together in one piece by crossbars and wherein a deformation region is provided at an end region of at least one of the web-shaped sections facing a respective one of the crossbars, the at least one of the web-shaped sections being curved in the deformation region.

17. The electronic device as recited in claim 16, wherein a respective deformation region is provided at a respective end region of a plurality of webshaped sections, and wherein the web-shaped sections are curved in the respective deformation regions in mutually opposing directions.

18. The electronic device as recited in one claim 9, wherein the metal elements are fibers of a woven fabric.

19. The electronic device as recited in claim 9, wherein the metal elements are fibers of a nonwoven fabric.

20. The electronic device as recited in claim 9, wherein the freedom-of-motion are filled with a solder that is in one of a doughy state and a liquid state at an operating temperature occuring in the freedom-of-motion spaces during operation of the device.

21. The electronic device as recited in claim 1, wherein the conductor parts include copper.

22. The electronic device as recited in claim 21, wherein the conductor parts are made of pure copper.

23. The electronic device as recited in claim 1, wherein the electrical device is configured as an output stage for driving an electrical machine, wherein the electrical device includes at least two semiconductor switches, and wherein at least one of the conductor parts acts as a conductor bridge interconnecting the semiconductor switches to form at least one half-bridge.

24. The electronic device as recited in claim 23, wherein the electrical machine is a brushless electromotor.

* * * * *